United States Patent
Shiobara (10) Patent No.: US 10,636,998 B2
(45) Date of Patent: Apr. 28, 2020

(54) ORGANIC LIGHT EMITTING DEVICE (71) Applicant: CANON KABUSHIKI KAISHA, Tokyo (JP)

(72) Inventor: Satoru Shiobara, Funabashi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 279 days.

(21) Appl. No.: 15/203,855

(22) Filed: Jul. 7, 2016

(65) Prior Publication Data
US 2017/0018735 A1 Jan. 19, 2017

(30) Foreign Application Priority Data

Jul. 15, 2015 (JP) ................................. 2015-141226

(51) Int. Cl.
*H01L 51/52* (2006.01)
*G03F 7/20* (2006.01)
*G03G 15/04* (2006.01)

(52) U.S. Cl.
CPC ...... *H01L 51/5253* (2013.01); *G03F 7/70008* (2013.01); *G03G 15/04054* (2013.01)

(58) Field of Classification Search
CPC ............. H01L 51/5253; H01L 51/5256; H01L 51/5237; G03F 7/70008; G03G 15/04054; G03G 15/04063; F21V 15/01; F21V 99/00; F21V 31/005; F21V 31/00
USPC ....................................................... 362/97.1
See application file for complete search history.

(56) References Cited

U.S. PATENT DOCUMENTS

| | | | | |
|---|---|---|---|---|
| 6,882,400 B2 * | 4/2005 | Kobayashi | .......... | H01L 51/5281 313/506 |
| 7,432,529 B2 * | 10/2008 | Yamazaki | ........... | H01L 27/3244 257/72 |
| 7,741,135 B2 | 6/2010 | Lee | | |
| 8,598,786 B1 * | 12/2013 | Kim | .................... | H01L 51/5253 257/40 |

(Continued)

FOREIGN PATENT DOCUMENTS

| | | |
|---|---|---|
| JP | 2005-203321 A | 7/2005 |
| JP | 2006-24421 A | 1/2006 |

(Continued)

OTHER PUBLICATIONS

Office Action dated Mar. 26, 2019, in counterpart application JP 2015-141226 (9 pages).

(Continued)

*Primary Examiner* — Bao Q Truong
(74) *Attorney, Agent, or Firm* — Venable LLP (57) ABSTRACT

Provided is an organic light emitting device, including: a plurality of pixels arranged on a substrate in at least one row along a longitudinal direction of the substrate, each of the plurality of pixels including a light emitting element part including, from the substrate side, a first electrode, an organic compound layer, and a second electrode in the stated order; and a sealing layer formed on the light emitting element part, the sealing layer covering an end of an inorganic material layer formed on a surface of the substrate or above the substrate, and formed below the organic compound layer, the sealing layer having an end formed on an inner side with respect to an end of the substrate at least in a transverse direction of the substrate.

20 Claims, 7 Drawing Sheets

(56) References Cited

U.S. PATENT DOCUMENTS

| | | |
|---|---|---|
| 8,928,007 B2 | 1/2015 | Akagawa et al. |
| 9,167,635 B2 | 10/2015 | Yamashita et al. |
| 9,231,156 B2 | 1/2016 | Yamane et al. |
| 9,876,064 B2 | 1/2018 | Kim et al. |
| 10,249,848 B2 | 4/2019 | Yoneda et al. |
| 10,541,288 B2 | 1/2020 | Kim et al. |
| 2006/0220056 A1 | 10/2006 | Lee |
| 2008/0203908 A1* | 8/2008 | Hasegawa ............ H01L 51/5265 313/504 |
| 2009/0200930 A1* | 8/2009 | Hayashi .............. H01L 27/3276 313/504 |
| 2010/0078627 A1* | 4/2010 | Yoshinaga .......... H01L 27/3246 257/40 |
| 2011/0260204 A1 | 10/2011 | Akagawa et al. |
| 2014/0034994 A1 | 2/2014 | Yamane et al. |
| 2014/0078233 A1 | 3/2014 | Yamashita et al. |
| 2014/0117342 A1 | 5/2014 | Kwon et al. |
| 2014/0203271 A1 | 7/2014 | Yoneda et al. |
| 2015/0001576 A1* | 1/2015 | Iwata ................. H01L 51/5246 257/100 |
| 2015/0060778 A1 | 3/2015 | Kim et al. |
| 2016/0041493 A1* | 2/2016 | Goden ................ H01L 27/3246 257/40 |
| 2018/0130862 A1 | 5/2018 | Kim et al. |

FOREIGN PATENT DOCUMENTS

| | | |
|---|---|---|
| JP | 2006-156133 A | 6/2006 |
| JP | 2006-286600 A | 10/2006 |
| JP | 2007-73460 A | 3/2007 |
| JP | 2010-76184 A | 4/2010 |
| JP | 2010-280066 A | 12/2010 |
| JP | 2011-123321 A | 6/2011 |
| JP | 2011-232482 A | 11/2011 |
| JP | 2014-62967 A | 4/2014 |
| JP | 2015-50181 A | 3/2015 |
| JP | 2015-118796 A | 6/2015 |
| WO | 2013/046545 A1 | 4/2013 |
| WO | 2013/065213 A1 | 5/2013 |

OTHER PUBLICATIONS

Office Action dated Oct. 29, 2019, in counterpart application JP 2015-141226 (10 pages).

Refusal dated Feb. 4, 2020, in counterpart application JP 2015-141226 (12 pages with machine translation).

\* cited by examiner

ORGANIC LIGHT EMITTING DEVICE

BACKGROUND OF THE INVENTION

Field of the Invention

The present invention relates to an organic light emitting device using an organic electroluminescence element.

Description of the Related Art

In recent years, printers employing a laser scanning system based on an electrophotographic technology are widely spread. In a general laser beam printer, light emitted from a laser light source is scanned by a scanning unit to expose a photosensitive member to light. Downsizing of the laser scanning unit is difficult due to its structure.

Besides, there has been investigated an LED printer method employing a system of exposing the photosensitive member to light with use of an elongated exposure light source (light emitting device: LED) including light emitting elements arranged in a row. This method enables the light source unit to be downsized, and hence this method is effective for downsizing the printer apparatus. Further, among the LEDs, in particular, an organic electroluminescence element (hereinafter referred to as "organic EL element") is a light emitting element having high definition and low power consumption, and thus is suitably used as a light emitting device for a light source unit of a printer apparatus. In Japanese Patent Application Laid-Open No. 2010-280066, there is disclosed an image forming apparatus using organic EL elements as the exposure light source.

The organic EL element is a sophisticated light emitting element, but it is known that its characteristic may be degraded due to moisture. Meanwhile, in order to produce a larger number of organic light emitting devices from one mother glass substrate for productivity enhancement, the substrate size per organic light emitting device is preferred to be as small or thin as possible. Therefore, the width of a region called a frame region, which is present at the end of the substrate and is outside of a region in which light emitting pixels are formed, is preferred to be as narrow as possible. However, in this case, there is a fear of reduction in sealing performance at the end of the substrate. Therefore, in order to maintain the light emitting performance of the organic EL element, it is important to consider how to suppress moisture intruding into the organic EL element from the end of the substrate.

SUMMARY OF THE INVENTION

The present invention has been accomplished so as to solve the above-mentioned problems, and is directed to providing an organic light emitting device having high reliability.

According to one aspect of the present invention, there is provided an organic light emitting device, including:
  a plurality of pixels arranged on a substrate in at least one row along a longitudinal direction of the substrate,
    each of the plurality of pixels including a light emitting element part including, from the substrate side, a first electrode, an organic compound layer, and a second electrode in the stated order; and
    a sealing layer formed on the light emitting element part,
    the sealing layer covering an end of an inorganic material layer formed on a surface of the substrate or above the substrate, and formed below the organic compound layer,
    the sealing layer having an end formed on an inner side with respect to an end of the substrate at least in a transverse direction of the substrate.

Further features of the present invention will become apparent from the following description of exemplary embodiments with reference to the attached drawings.

DESCRIPTION OF THE EMBODIMENTS

The present invention relates to an organic light emitting device in which, on a substrate, a plurality of pixels are arranged in at least one row along a longitudinal direction of the substrate. The present invention relates to an organic light emitting device in which, on a rectangular substrate having longitudinal sides and transverse sides, in particular, on an elongated substrate, a plurality of pixels are arranged in one row or more. Specifically, the present invention relates to an organic light emitting device in which pixels are arrayed in n rows (n≤4) along a longitudinal direction of a substrate, and in m columns (100≤m) along a transverse direction of the substrate. In the following description, the "pixel" has the same meaning as a light emitting pixel.

In the present invention, the pixel includes a light emitting element part including, from the substrate side, a first electrode, an organic compound layer, and a second electrode in the stated order. The "light emitting element part" herein employed has the same meaning as an organic EL element. In the present invention, the first electrode refers to an electrode that is closest to the substrate among the electrodes included in the light emitting element part, and the second electrode refers to an electrode that is more distant from the substrate than the first electrode. For example, when the first electrode and the second electrode are sequentially stacked on the substrate, the first electrode corresponds to a lower electrode, and the second electrode corresponds to an upper electrode. Further, in the present invention, the organic compound layer may be individually formed for each of the plurality of light emitting element parts, but the organic compound layer is preferred to be formed as a layer common to a plurality of pixels. It is more preferred that the organic compound layer be formed as a layer common to all of the pixels included in the organic light emitting device. In the present invention, the region for forming the organic compound layer is not particularly limited, but when the organic compound layer is formed as a layer common to the plurality of pixels, the organic compound layer is formed in conformity with the array of the pixels to have an elongated shape in plan view. Further, in the present invention, the second electrode may be individually formed for each of the plurality of light emitting element parts, but the second electrode is preferred to be formed as a layer common to all of the pixels. By forming the second electrode as a layer common to all of the pixels, the organic compound layer is covered with the second electrode.

In the present invention, a sealing layer is formed on the light emitting element part. In the present invention, the sealing layer covers an end of an inorganic material layer formed on the surface of the substrate or above the substrate, and formed below the organic compound layer. In the present invention, the inorganic material layer may be formed of a single layer or may be formed of a plurality of two or more layers depending on how drive circuits and wiring are formed. Further, in the present invention, at least in the transverse direction of the substrate, the end of the sealing layer is formed on the inner side with respect to the end of the substrate. By defining the end of the sealing layer as described above, a substrate surface exposed portion obtained by removing the sealing layer is formed at the end of the substrate. The action and effect generated by forming the substrate surface exposed portion are described later.

[Organic Light Emitting Device]

Now, referring to the drawings as appropriate, the present invention is described in detail by means of an embodiment, but the present invention is not limited to the embodiment described below. Further, technologies known or publicly known in the art can be applied to parts not particularly described below or parts not particularly illustrated in the drawings.

Figure 1:
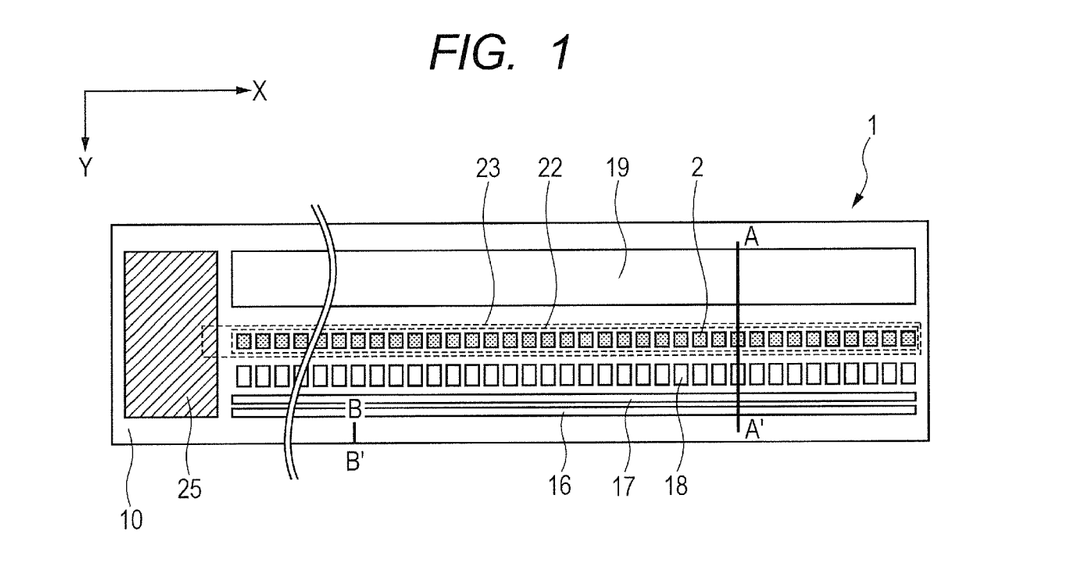
FIG. 1 is a schematic plan view for illustrating an example of an organic light emitting device according to an embodiment of the present invention.

FIG. 1 is a schematic plan view for illustrating an example of an organic light emitting device according to an embodiment of the present invention. Now, referring to FIG. 1, the organic light emitting device of the present invention is described from a planar perspective.

An organic light emitting device 1 illustrated in FIG. 1 includes, on a substrate 10, a plurality of members, that is, a plurality of pixels 2, a plurality of pixel circuits 18, a power line 17, a scanning circuit 16, a data line 19, and a wiring pad 25.

In the organic light emitting device 1 illustrated in FIG. 1, the pixel 2 includes a light emitting element part to be described later. The plurality of pixels 2 formed on the substrate 10 are arranged on the elongated (elongated rectangular) substrate 10 side by side in one row along an X direction being the longitudinal direction of the substrate 10. In the present invention, the array mode of the pixels 2 included in the organic light emitting device is not particularly limited as long as the pixels are arrayed in at least one row along the longitudinal direction (X direction) of the substrate 10. Specifically, the pixels 2 are arrayed in n rows (n≤4) along the longitudinal direction (X direction) of the substrate 10, and in m columns (100≤m) along a transverse direction (Y direction) of the substrate 10. In this case, when the organic light emitting device having the pixels 2 arranged in n rows and m columns (n≤4 and 100≤m) is used as an exposure light source of a laser beam printer configured to perform printing on an A4-sized sheet, the entire width in the longitudinal direction (X direction) in which the pixels 2 are arrayed is about 21.2 cm, which corresponds to a short side of the A4-sized sheet.

In FIG. 1, the pixel circuits 18 are members formed on the substrate 10. The pixel circuits 18 are arranged adjacent to the row of the pixels 2, and are arranged in parallel to the longitudinal direction (X direction) of the substrate 10 side by side in a row similarly to the pixels 2. The pixel circuits 18 are each configured to control a drive current of the pixel 2, and are arranged for the respective pixels 2 one by one. Therefore, in FIG. 1, when the pixels 2 are arrayed in a plurality of rows (n≥2), the pixel circuits 18 are also arrayed in a plurality of rows in conformity with the pixels 2.

The power line 17 and the scanning circuit 16 are arranged on the substrate 10 so as to be adjacent to the row of the pixel circuits 18. Further, the data line 19 is arranged on the opposite side to the side on which the row of the pixel circuits 18 is arranged with respect to the row of the pixels 2. Each of the pixel circuit 18, the power line 17, the scanning circuit 16, and the data line 19 forms a drive circuit configured to individually or collectively drive the plurality of pixels 2. The pixel circuit 18 and the scanning circuit 16 are formed of, for example, switching elements such as thin film transistors, or metal wiring made of aluminum or molybdenum. The power line 17 and the data line 19 are also formed of similar metal wiring. Details of the switching elements and the metal wiring described above are described later.

In the organic light emitting device in which the plurality of pixels 2 are arranged side by side in a row as in the organic light emitting device 1 illustrated in FIG. 1, it is difficult to arrange the drive circuits configured to drive the pixels 2 at four sides surrounding the region in which the pixels are formed. Therefore, as illustrated in FIG. 1, the drive circuits are arranged at two sides of two side portions of the row of the pixels 2 across the row of the pixels 2. The organic light emitting device 1 illustrated in FIG. 1 represents an example of the arrangement of the pixel circuit 18, the power line 17, the scanning circuit 16, and the data line 19. The arrangement side with respect to the row of the pixels 2 of each of the pixel circuit 18, the power line 17, the scanning circuit 16, and the data line 19, and the order of the arrangement can be individually determined.

In FIG. 1, the wiring pad 25 is arranged in a mode of being positioned proximally to one short side of the elongated substrate, but the arrangement mode of the wiring pad 25 is not limited to a mode of arranging the wiring pad 25 only at one position in the device as illustrated in FIG. 1. The wiring pad 25 may be arranged at two positions in total in a mode of being positioned proximally to both short sides of the substrate. The power line 17, the scanning circuit 16, the data line 19, and an upper electrode 23 are each electrically connected to the wiring pad 25. Further, the wiring pad 25 is electrically connected to a flexible cable with use of an anisotropic conductive film (ACF) or the like.

In the organic light emitting device 1 illustrated in FIG. 1, the light emission of each pixel 2 is controlled by a control signal input as appropriate from the drive circuit corresponding to each pixel 2. For example, a photosensitive member is exposed to light output from the pixels 2, and thus the organic light emitting device 1 illustrated in FIG. 1 can be used as a member for constituting an apparatus, e.g., a printer employing an electrophotographic system.

Figure 2:
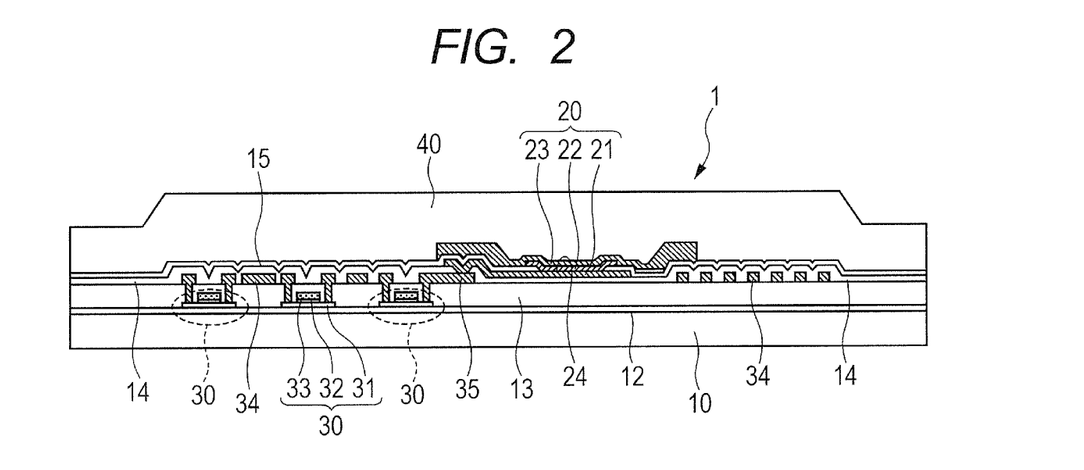
FIG. 2 is a schematic sectional view for illustrating an A-A' cross section of the organic light emitting device illustrated in FIG. 1.

FIG. 2 is a schematic sectional view for illustrating an A-A' cross section of the organic light emitting device illustrated in FIG. 1. Now, referring to FIG. 2, the organic light emitting device of the present invention is described from a sectional perspective.

In FIG. 2, on the substrate 10 formed of a glass substrate or the like, an undercoat layer 12 made of an inorganic insulating material, e.g., silicon oxide ($SiO_x$) or silicon nitride ($SiN_x$) is formed. On the undercoat layer 12, thin film transistors 30 each including a channel layer 31, a gate insulating layer 33, and a gate electrode 32 are formed. In FIG. 2, the thin film transistor 30 is a switching element forming any one of the drive circuits represented as the pixel circuit 18 and the scanning circuit 16 in FIG. 1.

In FIG. 2, on the undercoat layer 12 having the thin film transistors 30 formed thereon, an interlayer insulating film 13 (first interlayer insulating film) made of an inorganic insulating material, e.g., silicon oxide or silicon nitride is formed. On the interlayer insulating film 13, there are formed a source/drain electrode 35 electrically connected to the channel layer 31 and the gate electrode 32, which are included in each of the thin film transistors 30, via a connection hole (not shown) formed by processing a predetermined region of the interlayer insulating film 13, and metal wiring 34 forming the power line 17 and the data line 19 illustrated in FIG. 1.

In FIG. 2, on the interlayer insulating film 13 having the source/drain electrode 35 and the metal wiring 34 formed thereon, an interlayer insulating film 14 (second interlayer insulating film) made of an inorganic insulating material, e.g., silicon oxide or silicon nitride is formed. On the interlayer insulating film 14, there is formed a first electrode 21 (lower electrode) electrically connected to the source/drain electrode 35, which is included in each of the thin film transistors 30, via a connection hole (not shown) formed in a predetermined region of the interlayer insulating film 14.

On the interlayer insulating film 14 having the first electrode 21 formed thereon, a pixel isolation film 15 made of an inorganic insulating material, e.g., silicon oxide or silicon nitride is formed. The pixel isolation film 15 is configured to define a light emitting region of a light emitting element part 20 (organic EL element), and specifically, has an opening portion 24 for defining a predetermined region above the first electrode 21 as the light emitting region. The light emitting region of each pixel 2 is defined by the opening portion 24.

In FIG. 2, the light emitting element part 20 is an organic EL element in which the first electrode 21 (lower electrode), an organic compound layer 22, and the second electrode 23 (upper electrode) are sequentially stacked in the stated order from the substrate 10 side. In FIG. 1 and FIG. 2, the region in which each pixel 2 is formed corresponds to a light emitting region of the light emitting element part 20, that is, a region of the first electrode 21 which is not covered with the pixel isolation film 15 by forming the opening portion 24 in the predetermined region of the pixel isolation film 15.

On the pixel isolation film 15, the organic compound layer 22 is formed so as to contact with the lower electrode 21 in the opening portion 24, and extend on the pixel isolation film 15 from the inside of the opening portion 24. In the present invention, the mode of forming the organic compound layer 22 is not particularly limited, but as illustrated in FIG. 1, it is preferred to form the organic compound layer 22 into an elongated shape common to all of the plurality of pixels 2 arrayed in a line.

In FIG. 2, the organic compound layer 22 is a member having a single layer or a plurality of layers including at least an emission layer, and is preferred to be a stack including an emission layer and several layers with different functions. Examples of the layers that can be included in the organic compound layer 22 include a hole injection layer, a hole transport layer, an electron block layer, a hole block layer, an electron transport layer, and an electron injection layer. In the present invention, the total thickness of the organic compound layer 22 differs depending on the optical interference design, and is from 50 nm to 300 nm.

In FIG. 2, the organic compound layer 22 is preferred to be covered with the second electrode 23 formed on the organic compound layer 22. The term "cover" herein employed refers to a state in which the upper surface and the film ends of the organic compound layer 22 are covered with the second electrode 23. Similarly, a state in which an upper surface and film ends of a certain layer are covered with a layer arranged on the "certain layer" is referred to as "cover".

The constituent material of the second electrode 23 generally has high density and sealing performance, and hence the organic compound layer 22 is readily sealed by the second electrode 23. Therefore, by covering the organic compound layer 22 with the second electrode 23, resistance against moisture entrance from the outside is increased, and the reliability of the organic light emitting device 1 can be enhanced.

In the organic light emitting device of the present invention, light emitted from the emission layer is extracted from the side opposite to the substrate 10 (top emission system) or from the substrate 10 side (bottom emission system). Therefore, in the organic light emitting device of the present invention, in order to enable the above-mentioned light extraction, any one of the first electrode 21 and the second electrode 23 is formed of a transparent or translucent electrode. The opposing electrode of the electrode formed of the transparent or translucent electrode may be a reflective electrode, but the present invention is not limited thereto.

As the constituent material of the transparent electrode, indium tin oxide, indium zinc oxide, or the like can be given. As the constituent material of the translucent electrode, a metal material, e.g., aluminum or silver may be formed into a thin film having an appropriate thickness to have both transmittance and reflectivity. As the constituent material of the reflective electrode, the electrode is preferred to be mainly formed of a metal material having high reflectance in a visible range, e.g., aluminum or silver. An alloy made by combining a plurality of types of those metal materials can also be used as the constituent material of the reflective electrode. In the present invention, the electrode (21, 23) may be formed of a single layer, or may be formed of a stack electrode formed by stacking a plurality of layers. In the present invention, the thickness of the second electrode 23 may be determined in consideration of transmittance, reflectance, volume resistance, and the like, and is, for example, from 20 nm to 300 nm.

On the second electrode 23, a sealing layer 40 is formed of a thin film made of an inorganic material. The sealing layer 40 is preferred to be formed so as to cover the entire substrate 10. With this, the plurality of light emitting element parts 20 formed on the substrate 10 can be blocked from the external atmosphere. As the constituent material of the sealing layer 40, an inorganic material, e.g., silicon nitride, silicon oxynitride, silicon oxide, or aluminum oxide is preferred.

The thin film serving as the sealing layer 40 is preferred to be a thin film obtained by forming a film of silicon nitride, silicon nitride oxide, or silicon oxide by using sputtering or chemical vapor deposition (CVD). Further, a thin film obtained by forming a film of aluminum oxide or the like by using atomic layer deposition (ALD) is also preferred because a dense film can be formed. The sealing layer 40 may be a thin film made of any one type of the above-mentioned inorganic materials, or may be a stack film formed by stacking thin films made of the above-mentioned inorganic materials.

As illustrated in FIG. 2, the second electrode 23 is preferred to be covered with the sealing layer 40. The term "cover" herein employed refers to a state in which the upper surface and the film ends of the second electrode 23 are covered with the sealing layer 40. As described above, by forming the sealing layer 40 so as to cover the second electrode 23, the light emitting element part 20 can be blocked from the external atmosphere containing moisture, oxygen, or the like.

In the present invention, the water permeability being one of the sealing performance of the sealing layer 40 is preferred to be about $10^{-6}$ g/m$^2$·day, but the present invention is not limited to the material type selected for achieving this sealing performance. The wiring pad 25 is once covered with the sealing layer 40 in a process of manufacturing the organic light emitting device, but the wiring pad 25 is exposed to the outside in a different step and is then electrically connected to an external power source or the like.

In the present invention, the thickness of the sealing layer 40 is not particularly limited, but the thickness is preferred to be 2 μm or more from the viewpoint of the sealing performance.

Further, in the present invention, as a simple sealing structure for the light emitting element part 20, the sealing layer 40 may be formed into a desired thickness, and then the sealing layer 40 may be covered with a glass cap (not shown) or the like.

[Pixel Array Pattern]

Several arrangement patterns are conceivable for the plurality of pixels included in the organic light emitting device of the present invention. For example, a line-type light emitting device in which the pixels are arranged in 1 row and 2,506 columns is conceivable.

Figure 3A:
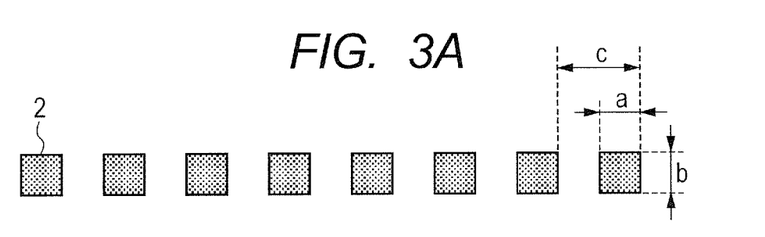
FIG. 3A, FIG. 3B, and FIG. 3C are schematic views for illustrating examples of a pixel array pattern.
Figure 3B:
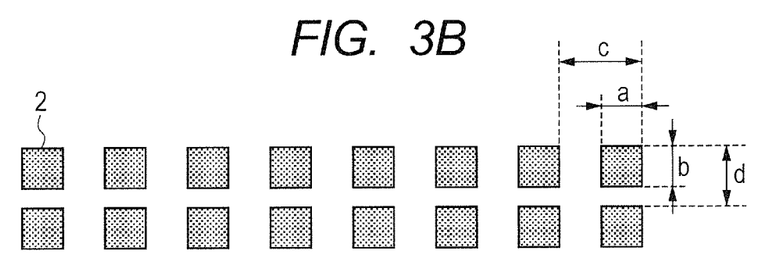
Figure 3C:
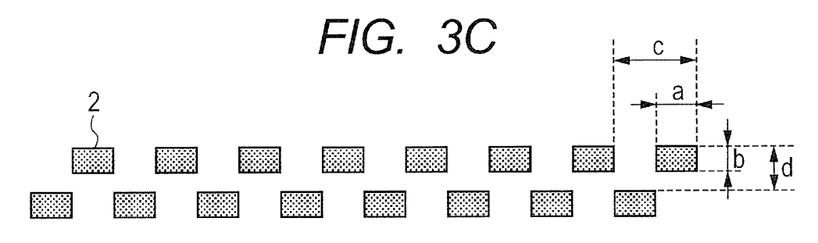

FIG. 3A to FIG. 3C are schematic views for illustrating examples of a pixel array pattern. In FIG. 3A, the pixels 2 are arranged in one row in the longitudinal direction of the substrate (not shown in FIG. 3A). FIG. 3A is an example of a case where a×b representing the size of the pixel 2 is 42.3 μm×42.3 μm, and a pitch c of the pixels 2 is 84.6 μm. As described above, when the pixels 2 are arranged in 1 row and 2,506 columns, the exposure width is 212 mm (84.6 μm×2,506 light emitting pixels). Further, in the elongated substrate on which the pixels 2 are formed, when the pixels 2 are arrayed as described above, for example, the longitudinal length of the substrate can be set to 219 mm, and the transverse length thereof can be set to 4.7 mm. In the present invention, as the transverse length of the elongated substrate becomes shorter, a larger number of substrates can be accordingly taken from one mother glass substrate. Specifically, the transverse length is preferred to be 10 mm or less, and is more preferred to be 1 mm or more and 10 mm or less.

In FIG. 3B, the pixels 2 are arranged in two rows in the longitudinal direction of the substrate (not shown in FIG. 3B). FIG. 3B represents an array pattern of the pixels 2 when the pixels 2 are arranged in, for example, 2 rows and 2,506 columns. In FIG. 3B, when the dimensions of a, b, and c in FIG. 3B are the same as those in FIG. 3A, the exposure width is 212 mm (84.6 μm×2,506 light emitting pixels) similarly to FIG. 3A. The exposure width is a parameter that is not affected by a transverse pitch d (67.7 μm).

Further, in the organic light emitting device of the present invention, as illustrated in FIG. 3C, the pixels 2 may be arranged in a staggered (zigzag) manner along the row direction (longitudinal direction of the substrate). In this case, as compared to FIG. 3A or FIG. 3B, the pixels 2 can be arranged in high density in the row direction. In FIG. 3C, a×b representing the size of the pixel 2 is 42.3 μm×25.4 μm, the longitudinal pitch c is 84.6 μm, and the transverse pitch d is 50.8 μm. In this case, the exposure width is 212 mm (42.3 μm×5,012 light emitting pixels).

[Mother Glass Substrate]

Figure 4:
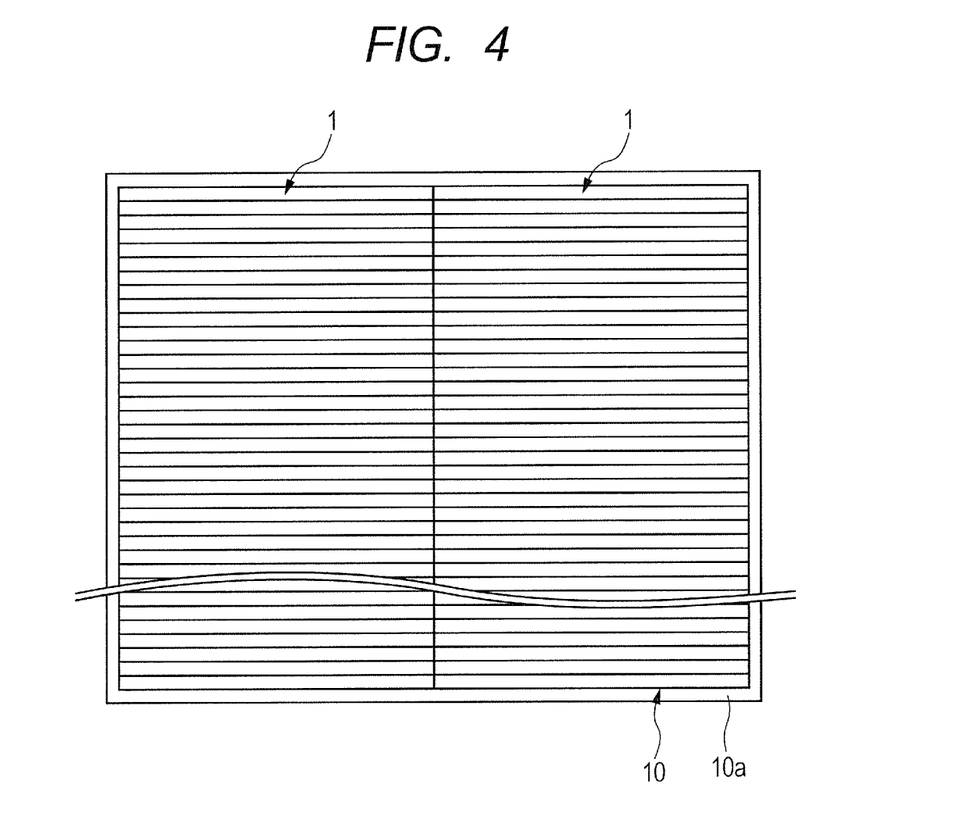
FIG. 4 is a schematic plan view for illustrating an example of a mother glass substrate to be used for manufacturing the organic light emitting device of the present invention.

FIG. 4 is a schematic plan view for illustrating an example of a mother glass substrate to be used when the organic light emitting device of the present invention is manufactured. By using one mother glass substrate 10a illustrated in FIG. 4, a plurality of organic light emitting devices of the present invention can be manufactured. Manufacturing a plurality of organic light emitting devices of the present invention from one mother glass substrate 10a is referred to as multi-piece manufacturing. When the one mother glass substrate 10a is subjected to multi-piece manufacturing to manufacture a large number of organic light emitting devices of the present invention, after the sealing layer 40 is formed, the mother glass substrate is cut by blade dicing or laser ablation dicing to cut out the organic light emitting devices one by one. For example, a case where a large number of elongated organic light emitting devices 1 (219 mm×4.7 mm) are manufactured from the second-generation mother glass substrate 10a (460 mm×365 mm) is considered. As illustrated in FIG. 4, 138 organic light emitting devices 1 can be manufactured by collectively arranging the organic light emitting devices 1 in the center portion of the mother glass substrate 10a in 69 rows and 2 columns. The longitudinal length of the substrate 10 having an elongated shape obtained through the cutting of the mother glass substrate 10a is determined based on, for example, the necessary exposure width as an exposure light source. Therefore, in order to increase the number of pieces to be manufactured, the transverse width of the elongated substrate 10 is required to be set as small as possible.

[Role of Sealing Layer]

Incidentally, in order to increase the reliability of the plurality of elongated organic light emitting devices manufactured from one mother glass substrate as described above even for long-term storage, the inventors of the present invention have found that challenges described below are required to be addressed.

Challenge of preventing permeation (lateral permeation) of atmosphere components (water, oxygen, and the like) from an end of an inorganic material layer 50.

Challenge of preventing occurrence of failure when cutting off from the mother glass substrate.

Figure 5A:
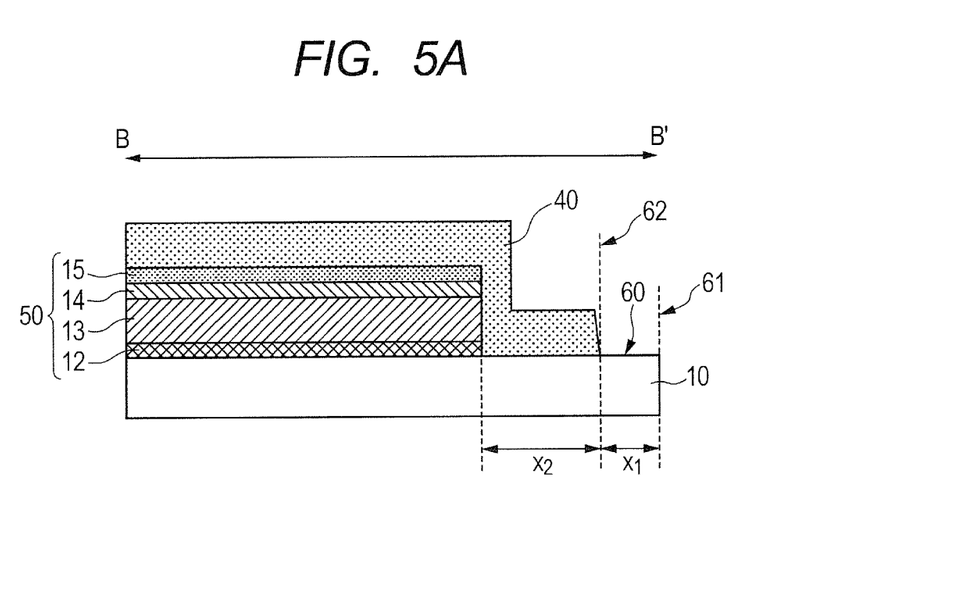
FIG. 5A and FIG. 5B are schematic sectional views for illustrating a B-B' cross section of the organic light emitting device illustrated in FIG. 1.
Figure 5B:
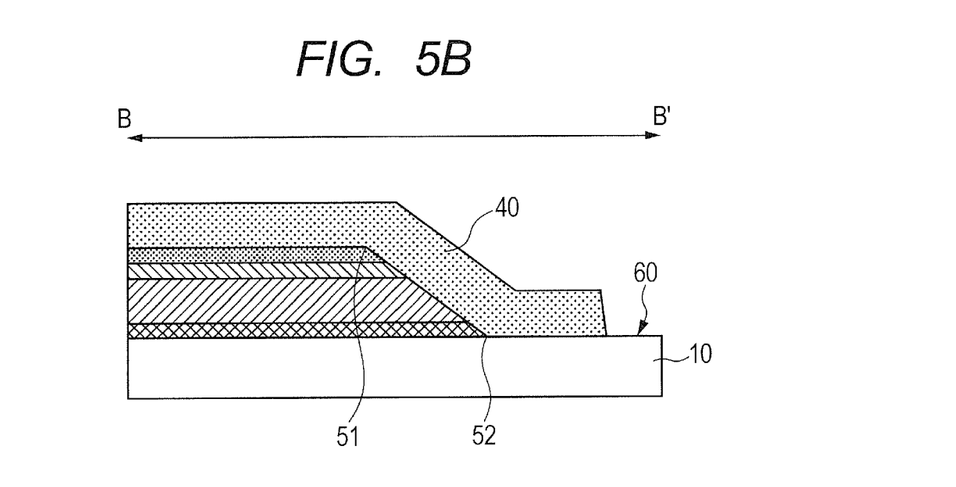

FIG. 5A and FIG. 5B are schematic sectional views for illustrating a B-B' cross section of the organic light emitting device illustrated in FIG. 1. In the organic light emitting device of the present invention, as illustrated in FIG. 5A and FIG. 5B, the end of the inorganic material layer 50 is covered with the sealing layer 40. In this case, covering the end of the inorganic material layer 50 with the sealing layer 40 refers to a state in which, as illustrated in FIG. 5A and FIG. 5B, the end of the inorganic material layer 50 on the transverse side of the organic light emitting device is covered with the sealing layer 40 so as to prevent the upper surface and the side surface of the inorganic material layer 50 from being exposed to the outside. In addition, covering the end of the inorganic material layer 50 with the sealing layer 40 refers to a state in which the end of the inorganic material layer 50 on the longitudinal side of the organic light emitting device is covered with the sealing layer 40 so as to prevent at least the upper surface of the inorganic material layer 50 from being exposed to the outside. In the present invention, it is preferred to cover also the end of the inorganic material layer 50 on the longitudinal side of the organic light emitting device with the sealing layer 40 so as not to expose the upper surface and the side surface of the inorganic material layer 50 to the outside similarly to the end of the inorganic material layer 50 on the transverse side. As illustrated in FIG. 5A, when the inorganic material layer 50 is a stack including a plurality of layers (12, 13, 14, and 15), all of the ends of the respective layers forming the stack are covered with the sealing layer 40. The inventors of the present invention have found that, with this configuration, degradation due to the atmosphere components such as water and oxygen that may permeate from the inorganic material layer 50 can be prevented, and thus reliability for long-term storage can be enhanced.

As an exemplary mode, as illustrated in FIG. 5B, the sectional shape of the end of the inorganic material layer 50 is inclined toward the center of the substrate 10, that is, toward the direction in which the pixels 2 are present. The sectional shape of the inorganic material layer 50 illustrated in FIG. 5B is a forward tapered shape.

As illustrated in FIG. 5A and FIG. 5B, by covering the inorganic material layer 50 with the sealing layer 40, the inorganic material layer 50 is prevented from being exposed to the atmosphere. The inorganic material layer 50 includes the interlayer insulating layer (13, 14) in many cases. As the constituent material of the interlayer insulating layer (13, 14), silicon oxide (SiO, $SiO_2$, or the like) is used, and it is known that the sealing performance of the silicon oxide film is lower than that of the silicon nitride film. Therefore, when the layer containing silicon oxide is exposed, entrance of water and oxygen from the end side of the substrate 10 is caused slowly but surely. Thus, a problem of luminance degradation may be caused when the organic light emitting device is stored for a long term.

Further, in the viewpoint of preventing the lateral permeation of water, oxygen, and the like, an inorganic compound is desired as the constituent material of the member (12, 13, 14, or 15) formed on the surface of the substrate 10 or above the substrate 10, and formed below the organic compound layer 22. This is because, when the constituent material of the "member" is an organic compound, e.g., polyimide, and if a defect is generated in the sealing layer 40 covering the "member", water or oxygen may quickly permeate from the "member" to lower the long-term reliability of the organic light emitting device. Further, when the constituent material of the "member" is an organic compound, the outgas generated from the constituent material itself may also lower the long-term reliability of the organic light emitting device.

Figure 6:
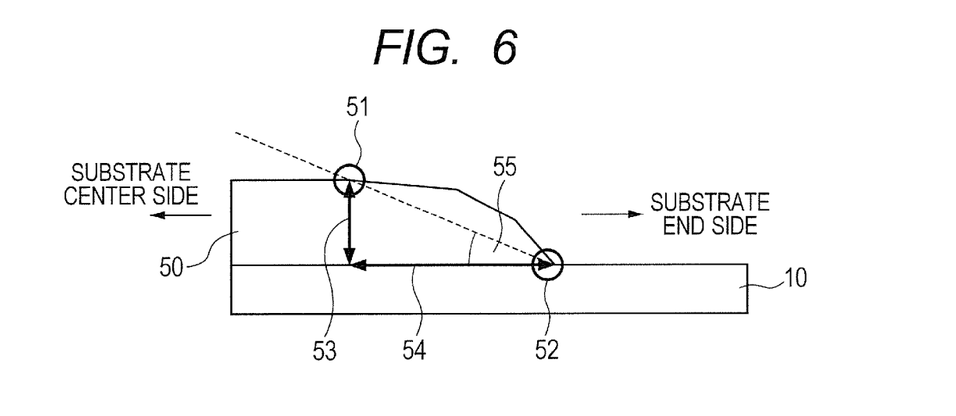
FIG. 6 is a schematic view for illustrating a taper angle of a cross section of an end of an inorganic material layer.

A taper angle (inclination angle of the cross section of the end of the inorganic material layer 50) when the cross section of the end of the inorganic material layer 50 is formed into a forward tapered shape as illustrated in FIG. 5B is described with reference to the drawings. FIG. 6 is a schematic view for illustrating the taper angle of the cross section of the end of the inorganic material layer 50. As described above, the inorganic material layer 50 includes a plurality of layers, but the inorganic material layer 50 is regarded as a single layer in FIG. 6. At a point 51, a total thickness 53 of the inorganic material layer 50 starts to reduce toward the lower layer, and at a point 52, the total thickness of the inorganic material layer 50 becomes zero. In FIG. 6, the taper angle of the inorganic material layer 50 corresponds to an inclination angle (θ) 55 of the cross section of the end of the inorganic material layer 50. As illustrated in FIG. 6, when θ is an acute angle on the center side of the substrate 10, the cross section of the end of the inorganic material layer 50 has a forward tapered shape. Further, the width of the inclined region of the cross section of the end of the inorganic material layer 50 is a region represented by reference symbol 54.

In the present invention, it is preferred that the end of the inorganic material layer 50 have a forward tapered shape with a taper angle (θ) smaller than 45°.

For example, a case where a film of silicon nitride is formed by chemical vapor deposition (CVD) to form the sealing layer 40 is considered. When the silicon nitride film that grows from the substrate 10 side is formed on an acute protrusion or on the cross section having a taper angle θ of 45° or more, a growth boundary may be generated during film formation by CVD to generate a crack with an air gap, and the crack may remain in the sealing layer 40. This air gap or crack becomes an entrance path of atmosphere gas components such as water and oxygen that may degrade the organic EL element. For such a reason, it is preferred that the taper angle (θ) of the cross section of the end of the inorganic material layer 50 be less than 45°. In this manner, the defect that may be generated inside the sealing layer 40 can be prevented, and an organic light emitting device having higher reliability can be obtained.

As illustrated in FIG. 5B, when the cross section of the end of the inorganic material layer 50 is formed into a forward tapered shape, it is preferred that, before forming the organic compound layer 22, the end of the inorganic material layer 50 be processed by photolithography and dry etching. Alternatively, in the process of sequentially forming the layers (12, 13, 14, and 15) of the inorganic material layer 50, during the step of forming and processing the drive circuit or the wiring, the layers of the inorganic material layer 50 may be appropriately processed.

Figure 7A:
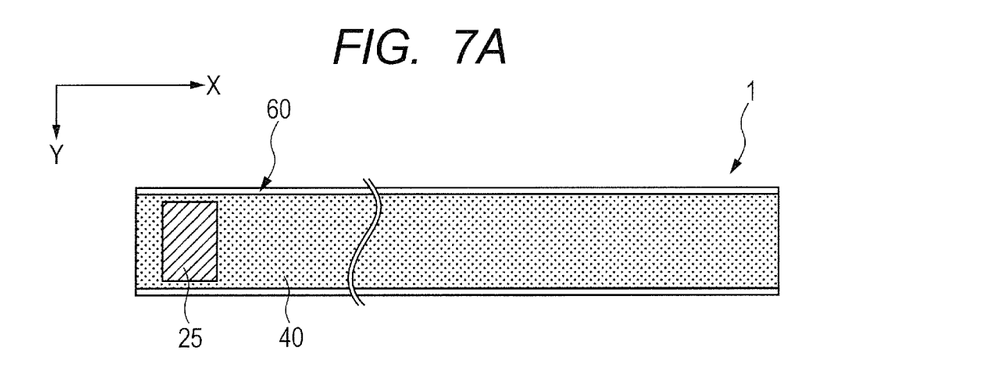
FIG. 7A and FIG. 7B are schematic plan views for illustrating the relationship between a sealing layer and a substrate surface exposed portion.

A method for solving the failure of the organic light emitting device that may be caused when the organic light emitting device is cut off from the mother glass substrate, which is the other challenge, is described below. In FIG. 5A and FIG. 5B, the substrate 10 has, at an end thereof, a part at which the surface of the substrate 10 is exposed, that is, a substrate surface exposed portion 60. With the substrate surface exposed portion 60, the failure of the organic light emitting device that may be caused when the organic light emitting device is cut off from the mother glass substrate can be solved. In FIG. 5A, between a cutting surface 61 of the substrate 10 and an end 62 of the sealing layer 40, there is a space having a width $x_1$, and the surface of the substrate 10 is exposed in this space. The substrate surface exposed portion 60 obtained by forming this space is formed on at least the transverse side of the substrate 10 as the line B-B' of FIG. 1. This is because, as described above, when the width particularly in the transverse direction in the frame region of the substrate is extremely reduced in order to increase the number of pieces to be manufactured in view of productivity, the pixel 2 and the end of the substrate 10 become close to each other. In view of this, in the present invention, as illustrated in FIG. 7A, the end of the sealing layer 40 is formed on the inner side with respect to the end of the substrate 10 so that the substrate surface exposed portion 60 is formed at least at each of the ends of the substrate 10 on the transverse direction (Y direction) side along the longitudinal direction (X direction) of the substrate 10. It is preferred that, as illustrated in FIG. 7B, all of the ends of the sealing layer 40 be formed on the inner side with respect to the ends of the substrate 10 so that the substrate surface exposed portion (60a, 60b) is formed around the entire substrate 10.

Figure 7B:
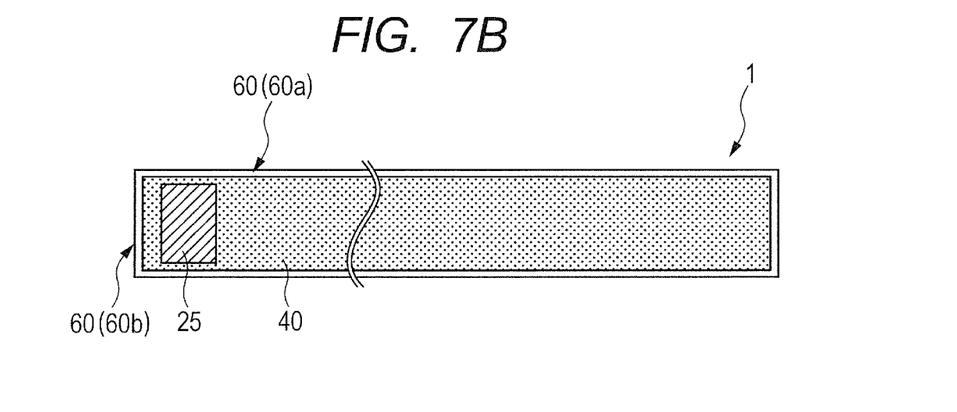

In FIG. 7A and FIG. 7B, the region for forming the substrate surface exposed portion 60 is formed as a single continuous region, but the present invention also encompasses a case where the region for forming the substrate surface exposed portion 60 is formed to be partially discontinuous due to variations in the manufacturing process.

By forming the substrate surface exposed portion 60 as described above, the sealing layers 40 are formed discontinuous in the respective organic light emitting devices when the organic light emitting devices are cut off from the mother glass substrate. In this manner, it is possible to prevent generation of sealing defects due to heat or stress during cutting, which may cause light emission failures. The width ($x_1$ in FIG. 5A) of the substrate surface exposed portion 60 is not particularly defined, but the width is preferred to be 10 µm or more in consideration of heat propagation or impact during cutting. Further, the width may vary depending on whether the cutting method is by scribing or by using laser.

The substrate surface exposed portion 60 is formed by processing the sealing layer 40. Therefore, the substrate surface exposed portion 60 is preferred to be formed in the same step as the step of removing the sealing layer 40 to form the wiring pad 25.

In FIG. 5A, a width $x_2$ of a region in which the sealing layer 40 is in contact with the substrate 10 can be appropriately set depending on the sealing performance of the sealing layer 40, but the width $x_2$ is preferred to be at least 2 µm or more, and is more preferred to be 10 µm or more.

[Application of Organic Light Emitting Device]

The organic light emitting device of the present invention may be applied to, for example, an exposure light source of an electrophotographic image forming apparatus.

The image forming apparatus of the present invention includes a photosensitive member, a charging unit configured to charge the surface of the photosensitive member, an exposure unit configured to expose the photosensitive member to light to form an electrostatic latent image, and a developing unit configured to apply developer to the photosensitive member to develop the electrostatic latent image formed on the surface of the photosensitive member. In this case, the exposure unit of the image forming apparatus includes the organic light emitting device of the present invention.

Further, the organic light emitting device of the present invention can be used as a component of an exposure apparatus configured to expose the photosensitive member to light. The exposure apparatus including the organic light emitting device of the present invention is, for example, an exposure apparatus in which the organic light emitting elements forming the organic light emitting device of the present invention are arranged to form a row along a predetermined direction.

Figure 8:
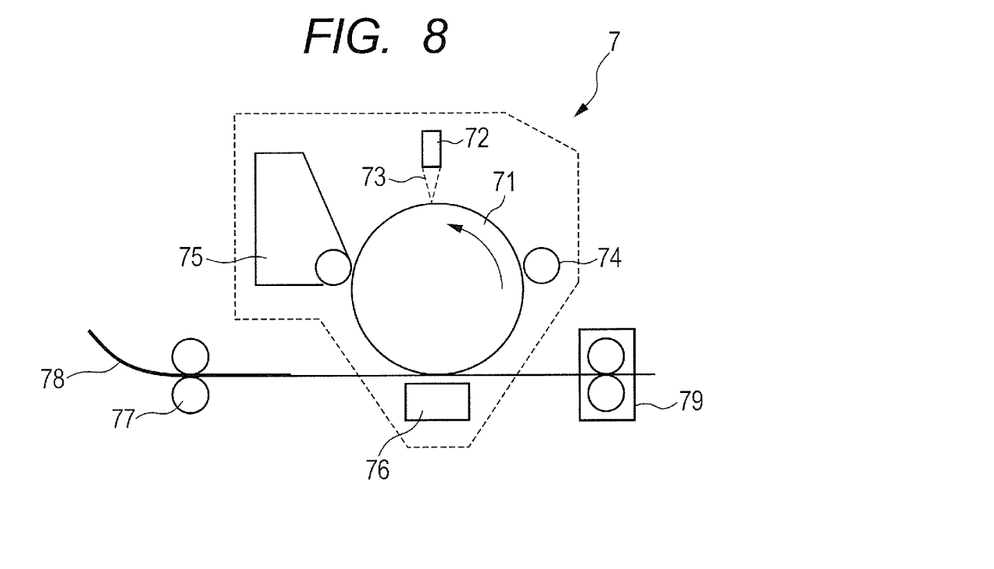
FIG. 8 is a schematic view for illustrating an example of an image forming apparatus including the organic light emitting device of the present invention.

FIG. 8 is a schematic view for illustrating an example of the image forming apparatus including the organic light emitting device according to the present invention. An image forming apparatus 7 illustrated in FIG. 8 includes a photosensitive member 71, an exposure light source 72, a developing device 74, a charging unit 75, a transfer device 76, conveyance rollers 77, and a fixing device 79.

In the image forming apparatus 7 illustrated in FIG. 8, the exposure light source 72 irradiates the photosensitive member 71 with light 73 to form the electrostatic latent image on the surface of the photosensitive member 71. The exposure light source 72 of the image forming apparatus 7 illustrated in FIG. 8 is the organic light emitting device according to the present invention. Further, in the image forming apparatus 7 illustrated in FIG. 8, the developing device 74 includes toner or the like. In the image forming apparatus 7 illustrated in FIG. 8, the charging unit 75 is arranged so as to charge the photosensitive member 71. In the image forming apparatus 7 illustrated in FIG. 8, the transfer device 76 is arranged so as to transfer the developed image onto a recording medium 78, e.g., paper. The recording medium 78 is conveyed to the transfer device 76 by the conveyance rollers 77. In the image forming apparatus 7 illustrated in FIG. 8, the fixing device 79 is arranged so as to fix the image formed on the recording medium 78.

Figure 9A:
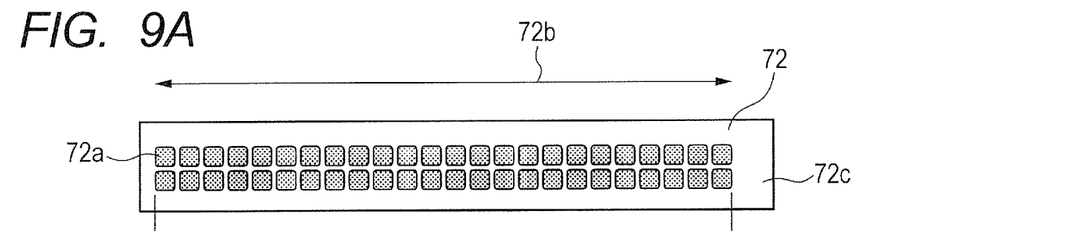
FIG. 9A and FIG. 9B are schematic plan views for illustrating specific examples of an exposure light source (exposure apparatus) constituting the image forming apparatus illustrated in FIG. 8.
Figure 9B:
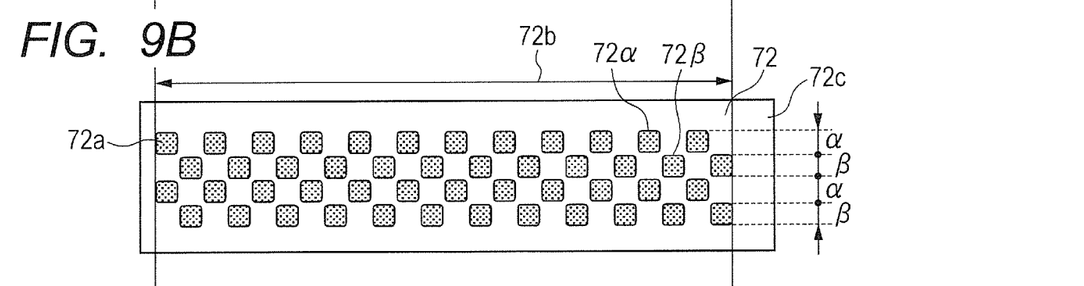
Figure 9C:
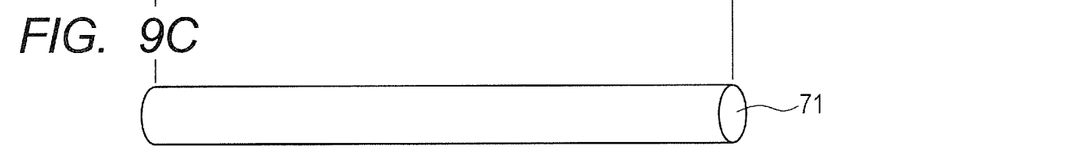
FIG. 9C is a schematic view for illustrating a specific example of a photosensitive member constituting the image forming apparatus illustrated in FIG. 8.

FIG. 9A and FIG. 9B are schematic plan views for illustrating specific examples of the exposure light source (exposure apparatus) constituting the image forming apparatus 7 illustrated in FIG. 8, and FIG. 9C is a schematic view for illustrating a specific example of the photosensitive member constituting the image forming apparatus 7 illustrated in FIG. 8. FIG. 9A and FIG. 9B have a common point that the exposure light source 72 includes a plurality of light emitting portions 72a respectively including organic light emitting elements and arranged in a row along a long-axis direction of an elongated substrate 72c. Further, an arrow 72b represents a row direction in which the light emitting portions 72a are arrayed. This row direction is the same as the direction of the axis about which the photosensitive member 71 rotates.

Incidentally, FIG. 9A is a mode in which the light emitting portions 72a are arranged along the axis direction of the photosensitive member 71. On the other hand, FIG. 9B is a mode in which the light emitting portions 72a are arranged alternately in the row direction in a first row α and a second row β. In FIG. 9B, the light emitting portions 72a in the first row α and the second row β are arranged at different positions in a column direction.

Further, in FIG. 9B, in the first row α, a plurality of light emitting portions 72α are arranged at predetermined intervals, while the second row β includes light emitting portions 72β at positions corresponding to the intervals of the light emitting portions 72α included in the first row α. That is, in the exposure light source of FIG. 9B, a plurality of light emitting portions are arranged at predetermined intervals also in the column direction.

In other words, the exposure light source illustrated in FIG. 9B includes the light emitting portions (72α and 72β) forming the exposure light source, which are arranged in, for example, a grid pattern, a houndstooth pattern, or a checkerboard pattern.

As described above, by driving the organic light emitting device of the present invention, stable display is possible for a long period of time with a satisfactory image quality.

EXAMPLES

Now, by means of Examples, the present invention is described in detail. In the organic light emitting devices manufactured in Examples, from the step of forming an underlying layer to the step of forming the pixel isolation film, even steps not described in Examples are included in the present invention as long as the steps are general in the semiconductor process. Further, the layer configuration of a substrate with an electrode to be described later varies depending on the drive circuit, and hence an example of the layer configuration is described in the following description. Further, the base material to be used may be silicon instead of glass. Further, in Examples below, the emission layer is set as a red emission layer, but emission layers of other colors may be employed, or the device may include emission layers of two types or more (a plurality of colors). Further, the arrangement of the light emitting pixels is also not particularly limited. In Examples below, although there are descriptions relating to the pixel arrays, the substrate size and the like are not restricted by the pixel arrays and the like, and hence the description thereof is omitted. Similarly, descriptions of the longitudinal length of each of the organic compound layer and the second electrode (upper electrode) are also omitted, but the length may be appropriately set in accordance with the size of the substrate.

Example 1

With methods described below, an organic light emitting device 1 illustrated in FIG. 1 was manufactured.

(1) Steps Until Forming Components of Substrate with Electrode on Glass Substrate First, on a glass substrate (substrate 10), the undercoat layer 12 was formed of silicon nitride being an inorganic insulating material by CVD. Then, on the undercoat layer 12, similarly to a known method of manufacturing a thin film transistor, the thin film transistors 30 each including the channel layer 31, the gate electrode 32, and the gate insulating layer 33 were formed. Then, on the undercoat layer 12 having the thin film transistors 30 formed thereon, the interlayer insulating film 13 was formed of silicon oxide being an inorganic insulating material by CVD. Then, by photolithography and dry etching, a connection hole (not shown) was formed in a partial region of the interlayer insulating film 13 so as to be opened above the electrode of each of the thin film transistors 30. After that, the source/drain electrode 35, the metal wiring 34, and the like were formed so as to be connected to the thin film transistor 30 via this connection hole. Then, on the interlayer insulating film 13 having the source/drain electrode 35 and the metal wiring 34 formed thereon, the interlayer insulating film 14 was formed of silicon oxide being an inorganic insulating material by CVD. Then, by photolithography and dry etching, a connection hole (not shown) was formed through the interlayer insulating film 14 so as to be opened above the source/drain electrode 35, and then a film of indium tin oxide (ITO) was formed in a predetermined region of the interlayer insulating film 14. Thus, the lower electrode 21 was formed so as to be connected to the source/drain electrode 35 via the connection hole formed by processing the interlayer insulating film 14. Then, on the interlayer insulating film 14 having the lower electrode 21 formed thereon, the pixel isolation film 15 was formed of silicon nitride or the like being an inorganic insulating material by CVD so as to have a thickness of 200 nm. The stack formed on the substrate 10 in the above-mentioned steps, which includes the undercoat layer 12, the interlayer insulating films (13 and 14), and the pixel isolation film 15 stacked in the stated order, corresponds to the inorganic material layer 50.

(2) Step of Processing Inorganic Material Layer

Next, by photolithography and dry etching, the pixel isolation film 15 was patterned to form the opening portion 24 for defining the light emitting region into 40 µm square. At this time, on the substrate 10, a total number of 500 pixels 2 (n=1, m=500) were formed in a line along the longitudinal direction (X direction in FIG. 1) of the organic light emitting device 1.

Incidentally, the opening portions 24 are formed on the mother glass substrate as illustrated in FIG. 3A to FIG. 3C. In the subsequent step, alignment marks for cutting are formed, and the mother glass substrate is cut along preset cutting lines (not shown) crossing the alignment marks, to thereby obtain the organic light emitting device 1. In view of this, in Example 1, in addition to the processing process of the pixel isolation film 15, processing of the inorganic material layer 50 was performed. Specifically, on the transverse side of the substrate 10, the inorganic material layer 50 included in each organic light emitting device 1 was processed so that a film end of the inorganic material layer 50 was formed on the center side of each organic light emitting device 1 by 40 µm from the preset cutting line of the substrate 10. More specifically, the inorganic material layer 50 formed at the end of the rectangular substrate 10 on the transverse side was processed. With this, the film end of the inorganic material layer 50 was formed so as to retreat by 40 µm along the longitudinal direction of each organic light emitting device 1. After that, before forming the organic compound layer 22, the substrate 10 was baked in vacuum at about 250° C. to dehydrate the members including the substrate 10.

(3) Step of Forming Organic Compound Layer

Then, on the lower electrode 21 exposed through the opening portion 24 of the pixel isolation film 15, the organic compound layer 22 was formed in a predetermined film forming region by vacuum deposition using an evaporation mask. The organic compound layer 22 was formed under a state in which the used evaporation mask was in close contact with the substrate 10. Further, in Example 1, the hole injection layer, the hole transport layer, the electron block layer, the emission layer, the hole block layer, the electron transport layer, and the electron injection layer were formed in the stated order to form the organic compound layer 22. Further, as the constituent material of each layer included in the organic compound layer 22, an available known material was used, and the emission color of the emission layer was set to red in accordance with the photosensitive wavelength of the photosensitive material.

(4) Step of Forming Upper Electrode

Next, the film of the upper electrode 23 was formed so as to cover the organic compound layer 22. Aluminum was used as the constituent material of the upper electrode 23, and the film of the upper electrode 23 having a thickness of 200 nm was formed in a predetermined film forming region by vapor deposition using an evaporation mask.

(5) Step of Forming Sealing Layer

Next, the sealing layer 40 was formed of a thin film of silicon nitride by CVD over the entire surface of the substrate 10 so as to have a thickness of 2 µm. With this, the upper electrode 23 was covered with the sealing layer 40.

(6) Step of Processing Sealing Layer

Next, photolithography and dry etching were performed to expose the wiring pad 25 covered with the sealing layer 40. Further, in the same step, each organic light emitting device was processed so that the end of the sealing layer was formed on the center side of the organic light emitting device 1 by 10 µm with respect to the preset cutting line on the transverse side of a substrate 10 of the organic light emitting device 1. With this, as illustrated in FIG. 7A, the film end of the sealing layer was formed so as to retreat by 10 μm along the longitudinal direction of each organic light emitting device 1.

(7) Step of Cutting Substrate

The mother glass substrate was cut with a laser cutter on the preset cutting lines to obtain the elongated organic light emitting device 1.

Example 2

In Item (2) of Example 1, on the transverse side and on the longitudinal side of the substrate 10, the inorganic material layer 50 included in each organic light emitting device 1 was processed so that the film end of the inorganic material layer 50 was formed on the center side of each organic light emitting device 1 by 40 μm from the preset cutting line of the substrate 10. Specifically, the inorganic material layer 50 formed at the ends of the rectangular substrate 10 on the transverse side and on the longitudinal side was processed. With this, the film end of the inorganic material layer 50 was formed so as to retreat by 40 μm along the transverse direction and the longitudinal direction of each organic light emitting device 1. Further, in Item (6) of Example 1, each organic light emitting device was processed so that the end of the sealing layer 40 was formed on the center side of the organic light emitting device 1 by 10 μm with respect to the preset cutting line of the substrate 10 around the entire organic light emitting device 1. With this, as illustrated in FIG. 7B, the film end of the sealing layer 40 was formed so as to retreat by 10 μm around the entire organic light emitting device 1. Other parts were formed by a method similar to that of Example 1 to obtain the organic light emitting device 1.

Comparative Example 1

Figure 10A:
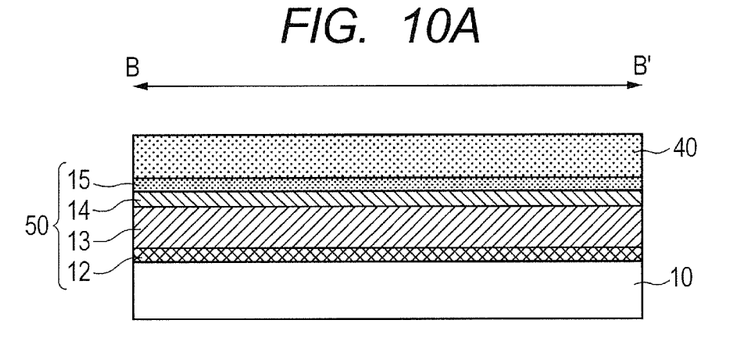
FIG. 10A is a schematic sectional view of a transverse end of an organic light emitting device manufactured in Comparative Example 1.

In Item (2) of Example 1, the processing of the inorganic material layer 50 formed on the preset cutting line of the substrate 10 was omitted, and further, in Item (6) of Example 1, the processing of the sealing layer 40 formed on the preset cutting line of the substrate 10 was omitted. Other parts were formed by a method similar to that of Example 1 to obtain the organic light emitting device. The cross section of the transverse end of the organic light emitting device obtained by Comparative Example 1 was as illustrated in FIG. 10A.

Comparative Example 2

Figure 10B:
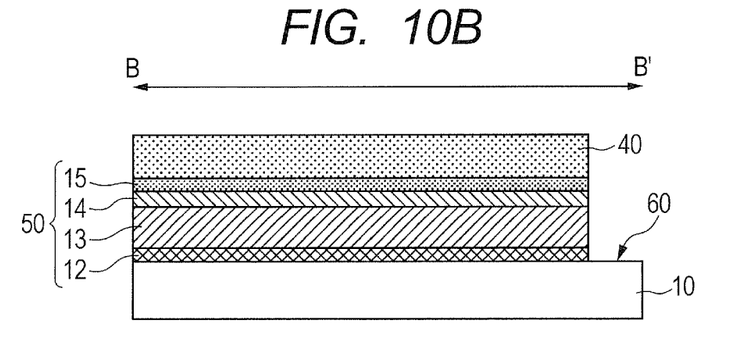
FIG. 10B is a schematic sectional view of a transverse end of an organic light emitting device manufactured in Comparative Example 2.

In Item (2) of Example 1, the processing of the inorganic material layer 50 formed on the preset cutting line of the substrate 10 was omitted, but other parts were formed by a method similar to that of Example 1 to obtain the organic light emitting device. In Comparative Example 2, when the sealing layer 40 was processed by a method similar to that of Item (6) of Example 1, the inorganic material layer 50 formed under the sealing layer 40 was removed together. Further, the cross section of the transverse end of the organic light emitting device obtained by Comparative Example 2 was as illustrated in FIG. 10B.

Comparative Example 3

Figure 10C:
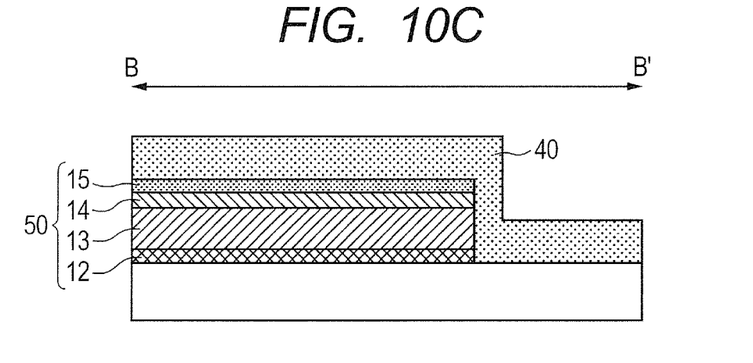
FIG. 10C is a schematic sectional view of a transverse end of an organic light emitting device manufactured in Comparative Example 3.

In Item (6) of Example 1, the processing of the sealing layer 40 was omitted, but other parts were formed by a method similar to that of Example 1 to obtain the organic light emitting device. The cross section of the transverse end of the organic light emitting device obtained by Comparative Example 3 was as illustrated in FIG. 10C.

[Reliability Evaluation]

In order to confirm the long-term storage reliability, after the organic light emitting devices were subjected to a storage test of 500 hours in a thermostatic chamber with a temperature of 85° C. and a humidity of 85%, the organic light emitting devices were driven to evaluate the light emission state. As a result, in Example 1, generally satisfactory light emission was maintained, but light emission failure was observed in a part of the light emitting pixels close to the longitudinal end on an opposite side to the wiring pad 25. Further, all of the pixels in the organic light emitting device of Example 2 maintained a satisfactory light emission state. On the other hand, in the organic light emitting devices of Comparative Examples 1 and 3, due to defects of flaws of the sealing layer 40 caused by the damage during cutting around the substrate cutting portion, water and oxygen intruded from the defects to cause light emission failure. Further, in the organic light emitting devices of Comparative Examples 1 and 2, water and oxygen intruded from the exposed end of the inorganic material layer 50. Thus, as compared to the organic light emitting devices of Examples, luminance was reduced when the organic light emitting device was driven with the same voltage.

From the results of the evaluations above, it has been found that, by covering the film end of the inorganic material layer 50 at least on the transverse side of the rectangular substrate with the sealing layer 40, and further retreating the end of the sealing layer 40 from the end of the substrate 10 to form the region 60 in which the surface of the substrate 10 is exposed, the organic light emitting device having high long-term reliability can be obtained.

According to the present invention, the organic light emitting device having high reliability can be obtained. Further, the present invention is useful in an elongated organic light emitting device, in particular.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-141226, filed Jul. 15, 2015, which is hereby incorporated by reference herein in its entirety.

What is claimed is:

1. An organic light emitting device comprising:
   a substrate;
   a layer disposed over the substrate;
   a plurality of pixels arranged over the layer; and
   a sealing layer disposed over the plurality of pixels and being in contact with a side surface of the layer,
   wherein the sealing layer comprises a plurality of layers.

2. The organic light emitting device according to claim 1, wherein the layer comprises a plurality of layers, and
   wherein the sealing layer covers all of ends of the plurality of layers included in the layer.

3. The organic light emitting device according to claim 1, wherein the end of the layer has a cross section formed into a forward tapered shape.

4. The organic light emitting device according to claim 1, wherein all ends of the sealing layer are formed on the inner side with respect to the end of the substrate.

5. The organic light emitting device according to claim 1, wherein the organic compound layer is a layer common to each pixel of the plurality of pixels.

6. The organic light emitting device according to claim 1, wherein the layer comprises a layer containing silicon oxide.

7. The organic light emitting device according to claim 1, wherein each of the plurality of pixels comprises a light emitting element part comprising, from the substrate side, a first electrode, an organic compound layer, and a second electrode in the stated order.

8. The organic light emitting device according to claim 1, wherein the sealing layer contains any one of silicon nitride, silicon oxynitride, silicon oxide, and aluminum oxide.

9. The organic light emitting device according to claim 1, wherein the plurality of pixels are arrayed in n rows, where n≤4, in the longitudinal direction of the substrate, and are arrayed in m columns, where m≥100, in the transverse direction of the substrate.

10. The organic light emitting device according to claim 1, wherein the plurality of pixels are arrayed in a staggered manner along the longitudinal direction of the substrate.

11. An image forming apparatus comprising:
a photosensitive member;
an exposure unit configured to expose the photosensitive member to light;
a charging unit configured to charge the photosensitive member; and
a developing unit configured to apply developer to the photosensitive member,
the exposure unit comprising the organic light emitting device according to claim 1,
the organic light emitting device comprising a plurality of light emitting portions, and
the plurality of light emitting portions being arranged along a long-axis direction of the photosensitive member.

12. An exposure apparatus configured to expose a photosensitive member to light, the exposure apparatus comprising the organic light emitting device according to claim 1,
the organic light emitting device comprising a plurality of light emitting portions, and
the plurality of light emitting portions being arranged along a long-axis direction of the photosensitive member.

13. The organic light emitting device according to claim 1, wherein the sealing layer is in contact with the substrate.

14. The organic light emitting device according to claim 7, wherein the second electrode is an electrode common to each pixel of the plurality of pixels.

15. The organic light emitting device according to claim 1, wherein an end of the sealing layer is disposed at an inner side with respect to the end of the substrate.

16. The organic light emitting device according to claim 3, wherein the forward tapered shape has a taper angle that is smaller than 45°.

17. The organic light emitting device according to claim 1, wherein the sealing layer includes a first layer and a second layer, the first layer containing first inorganic material and the second layer containing second inorganic material different from the first inorganic material.

18. The organic light emitting device according to claim 8, wherein the sealing layer includes a first layer and a second layer, the first layer containing silicon nitride and the second layer containing aluminum oxide.

19. The organic light emitting device according to claim 18, wherein the first layer and the second layer are stacked.

20. The organic light emitting device according to claim 1, wherein the layer is an inorganic material layer.

* * * * *